United States Patent [19]

Sugihara et al.

[11] Patent Number: 4,467,210

[45] Date of Patent: Aug. 21, 1984

[54] ELECTRON-BEAM IMAGE TRANSFER DEVICE

[75] Inventors: Kazuyoshi Sugihara, Yokohama; Toru Tojo, Yamato; Ichiro Mori, Tokyo; Toshiaki Shinozaki, Yokohama, all of Japan

[73] Assignee: Tokyo Shibaura Denki Kabushiki Kaisha, Kawasaki, Japan

[21] Appl. No.: 379,712

[22] Filed: May 18, 1982

[30] Foreign Application Priority Data

May 26, 1982 [JP] Japan .................. 56-79563

[51] Int. Cl.³ .............................. H21J 37/00
[52] U.S. Cl. .................. 250/492.2; 250/441.1; 250/442.1; 219/121 EL
[58] Field of Search .............. 250/398, 400, 492.2, 250/441.1, 442.1; 219/121 EL, 121 EN

[56] References Cited

U.S. PATENT DOCUMENTS

| | | | |
|---|---|---|---|
| 3,430,029 | 2/1969 | Hinrichs | 219/121 EL |
| 3,679,497 | 7/1972 | Handy et al. | 250/492.2 |
| 3,756,435 | 9/1973 | Steigerwald | 219/121 EN |
| 4,013,262 | 3/1977 | Schott et al. | 250/442.1 |

Primary Examiner—Bruce C. Anderson
Attorney, Agent, or Firm—Oblon, Fisher, Spivak, McClelland & Maier

[57] ABSTRACT

An electron-beam image transfer device includes an evacuated vessel having a main chamber and spare chamber extended therefrom and a specimen holder and mask holder disposed in the main chamber. A subchamber is formed near the spare chamber to house a specimen. The specimen in the subchamber is transferred to the spare chamber by a movable support through an opening which is always kept in an airtight state, and then brought to the specimen holder by a transferring mechanism.

6 Claims, 12 Drawing Figures

ELECTRON-BEAM IMAGE TRANSFER DEVICE

BACKGROUND OF THE INVENTION

The present invention relates to an electron-beam image transfer device for transferring a pattern on a photoelectric mask onto a specimen such as a semiconductor wafer.

With the recent increase in the integrated circuit density, photolithography which had so far constituted the mainstream of the micropattern forming technology came to be found to have its limitations and a rapid progress has been made in a new lithographic method using electron-beams and X-rays to overcome such limitations. As a result there has recently invented an electron-beam image transfer device in which a photoelectric mask which is disposed parallel to a specimen is irradiated with ultraviolet rays and the photoelectrons which are liberated as a result are focused on the specimen by means of the uniform electric field and magnetic field between the specimen and the mask so that the whole pattern can be transferred from the mask to the specimen. This device has practical advantage in that it offers high productivity because it is capable of high-speed image transfer and that it permits the use of the conventional techniques because the photoelectric mask used is similar in construction to the photomask and that it enables the transfer of an image onto an irregular surface because of a deep depth of focus. For these reasons, this device is highly promising for use in the processing of submicron patterns. The effectiveness of equipment like this is mentioned in literature such as R. Ward, J. Vac. Sci. Technology, 1b(b), Nov/Dec, 1979.

FIG. 1 is a schematic diagram showing an exemplary electron-beam image transfer device. In FIG. 1, numeral 1 shows a vacuum vessel which constitutes the image transfer chamber. This vessel 1 is evacuated to somewhere around $10^{-6}$ Torr by means of a vacuum pump. In the evacuated vessel 1 are disposed a specimen holding means 4 for holding a specimen 3 and a photoelectric mask holding means 6 for holding a photoelectric mask 5. The specimen 3 and the photoelectric mask 5 are spaced about 10 mm apart in facing relation to each other. As seen from the enlarged view shown in FIG. 2, said photoelectric mask is formed by a quartz plate 5a which passes ultraviolet rays, a master pattern 5b which consists of ultraviolet ray absorbing material forming the desired pattern on the quartz plate, and a photoelectric surface 5c made of CsI which emits photoelectrons when it receives the ultraviolet rays coming through the master pattern 5b. The surface of said specimen 3 which faces the photoelectric mask 5 is coated with electron-beam sensitive resist 3a. A detector 7 detects the relative position of the specimen 3 and the photoelectric mask so that they may be properly positioned by thus obtained information.

The light source 8 is provided outside said evacuated vessel 1. The light source 8 emits ultraviolet rays which are caused to strike said photoelectric mask 5 through an ultraviolet ray passing window 10 when a shutter 9 is opened. Outside the evacuated vessel 1 are also provided Helmholtz coils 11 and a DC power source 12. A magnetic field is produced along the direction in which said specimen 3 and mask 5 are placed by means of said coil 11 and an electric field is produced in the same direction by means of said power source 12. The numerals 13, 14, 15 in FIG. 1 indicate a support plate, shock-absorbing rubber, and mount, respectively.

When the ultraviolet rays from said light source 8 are incident on the photoelectric mask 5, said mask 5 emits photoelectrons according to the mask pattern 5b and thus liberated photoelectrons are focused by said magnetic and electric fields and projected onto the specimen 3. As a result the resist 3a of the specimen 3 is exposed according to said master pattern 5b. Thus the whole image of the master pattern 5b can be transferred to the specimen 3 to provide the previously mentioned advantage.

However, this type of equipment was associated with the following problems. When the transfer of a pattern is completed, it is necessary to change the specimen 3. Since the vacuum vessel is opened to the atmosphere each time the specimen 3 is changed, the photoelectric mask 5 undergoes serious deterioration by absorbing moisture. It is also necessary to evaporate a coating of CsI on the surface of the photoelectric mask 5 each time about 50 patterns have been transferred, thus so much lowering productivity. Furthermore the specimen table 2 or the mask table 4 must be removed out of the image transfer chamber 1 when the specimen 3 or the photoelectric mask 5 is changed and as a result the image transfer accuracy is reduced by the effects of dust and temperature changes.

SUMMARY OF THE INVENTION

The object of the present invention is to provide an electron-beam image transfer device which eliminates the need to open the specimen chamber to the atmosphere each time the specimen is changed, makes it possible to greatly increase productivity, and enables the prevention of the adverse effects of dust and temperature changes.

As aspect of the present invention there is to provide an electron-beam image transfer device for transferring a pattern on a photoelectric mask onto a specimen comprising an evacuated vessel having a main chamber, a specimen holder disposed in said main chamber to hold said specimen detachably in fixed position, a mask holder disposed in said main chamber to hold said photoelectric mask detachably in fixed position in facing relation to said specimen, means to impress a magnetic field and an electric field to said specimen and photoelectric mask in the direction in which they face each other, first and second subchambers disposed in the proximity of said evacuated vessel to house the specimen and photoelectric mask, respectively, first and second gates disposed between the main chamber and the first and second subchambers to enable selective connection and an airtight seal between them, a first auxiliary transferring mechanism to transfer the specimen from said first subchamber into the main chamber through said first gate, a second auxiliary transferring mechanism to transfer the photoelectric mask from said second subchamber into the main chamber through the second gate, a main transferring mechanism to transfer the specimen and photoelectric mask, which have been brought into the main chamber, onto said specimen holder and mask holder, and an evacuating means to evacuate said main chamber and subchambers.

In an electron-beam image transfer device embodying the present invention, the specimen or the photoelectric mask can be changed without destroying the vacuum in the main chamber and therefore it is possible to greatly enhance the productivity and to prevent the qualitative deterioration of the specimen due to the external conditions such as moisture. The transfer of specimen and photoelectric mask between the subchamber and the main chamber is achieved automatically by means of the auxiliary transfer device, thus so much increasing the productivity.

DETAILED DESCRIPTION OF THE PREFERRED EMBODIMENTS

An embodiment of the present invention will be hereinunder described with reference to the accompanying drawings.

Figure 3:
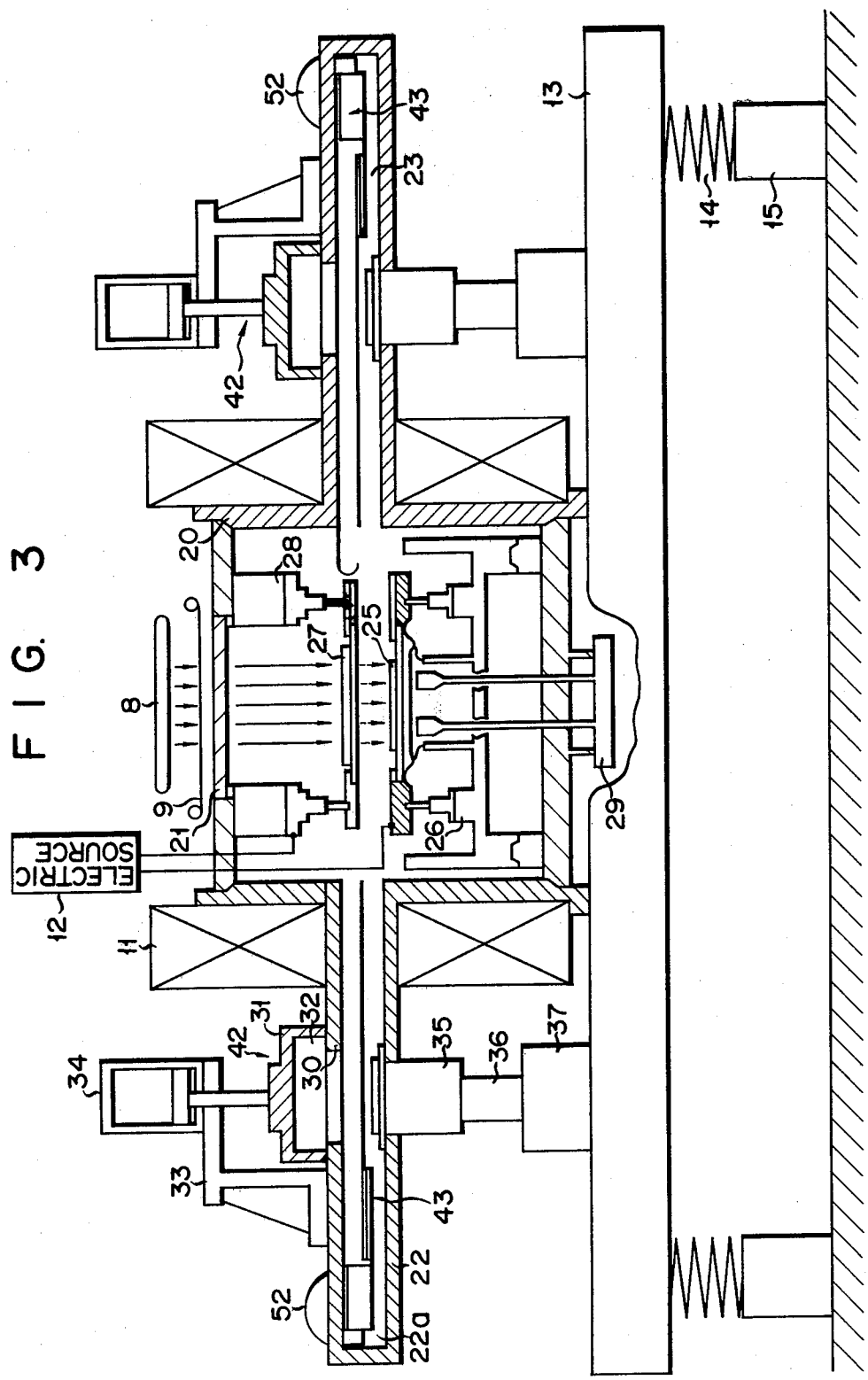
FIGS. 3 and 4 are a sectional view and a plan view of an electron-beam image transfer device according to one embodiment of the present invention.
Figure 4:
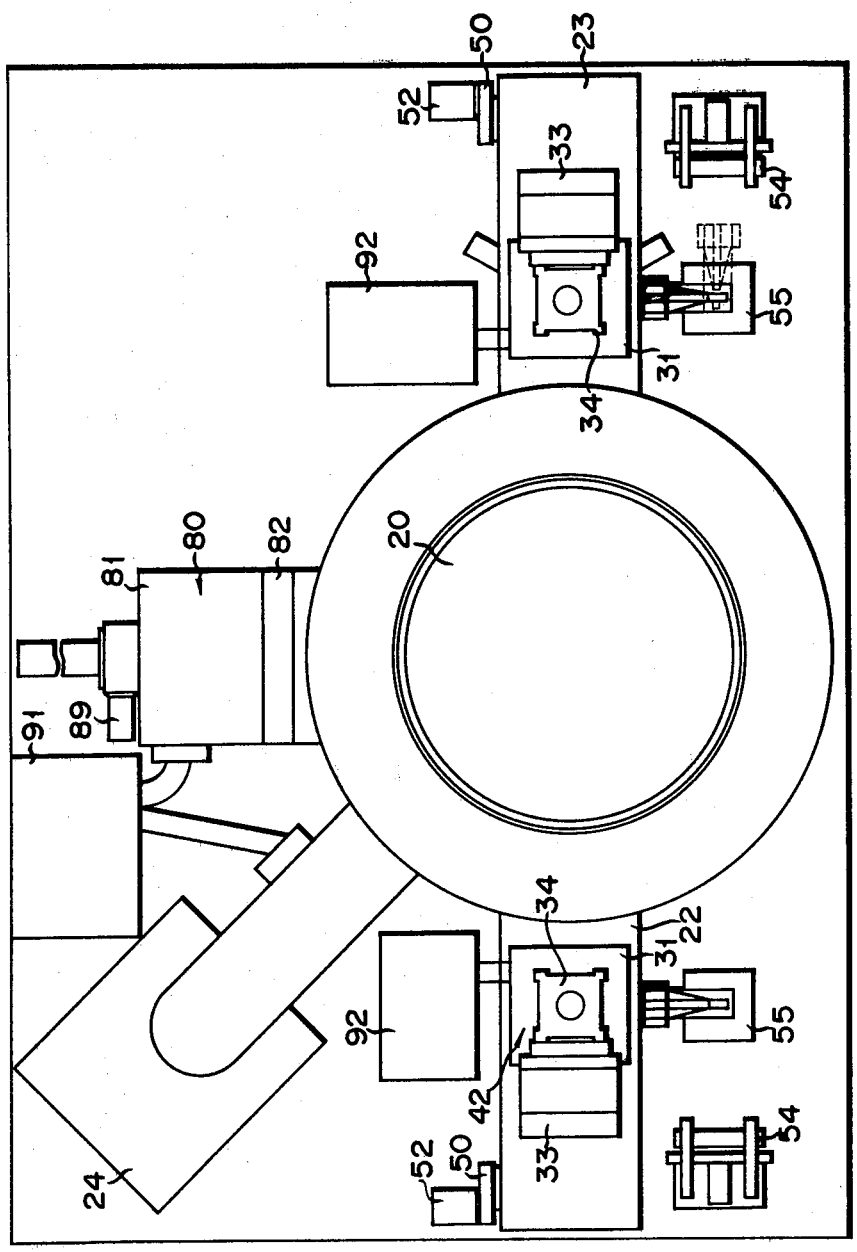

In FIGS. 3 and 4, numeral 20 designates a cylindrical evacuated vessel in which an image transfer chamber is formed, which is vertically positioned so that an ultraviolet ray passing window 21 formed on one end of it may be on top. On the peripheral wall of the evacuated vessel are formed first and the second projections 22, 23, in facing relation to each other. In these projections there are formed the first wafer spare chamber 22a and the second wafer spare chamber 23a connecting with said image transfer chamber and extending in opposite directions. The main chamber is composed of these spare chambers and the image transfer chamber. The image transfer chamber is also connected with a vacuum pump 24, by means of which the image transfer chamber and the spare chambers are evacuated to a vacuum of about $10^{-6}$ Torr.

In said image transfer chamber are disposed the specimen holding plate 26 on which a specimen (wafer) 25 is supported in fixed position with the electron-beam sensitive resist coated side up and a mask support mechanism 28 which holds a photoelectric mask 27 with the mask pattern side faced downward. The specimen stand 26 and the mask support mechanism 28 are constructed by $XYZ\theta\psi p$-tables, respectively which enable accurate positioning of specimen 25 and photoelectric mask 27 (photoelectric mask cassette) in a desired position. Numeral 29 indicates the detector to detect the position of specimen 25. The specimen 25 is properly positioned according to the signal from this detector.

A circular opening 30 is formed in a part of the upper wall of said first projection 22. This opening 30 may be closed with the first moving member 31, the lower end of which is contact with the outside surface of the upper wall of the projection 22. In this moving member 31 is formed a subchamber 32 so that it connects with the first wafer spare chamber 22a in the projection 22 via said opening 30. Above the moving member 31 is disposed a hydraulic cylinder or air cylinder 34 supported by a supporting member 33 and the lower end of a piston of the cylinder 34 is coupled with the moving member 31. Thus the moving member 33 is moved up and down by means of the hydraulic or air cylinder 34. When it is moved upward, the opening 30 is exposed to the outside.

Figure 5:
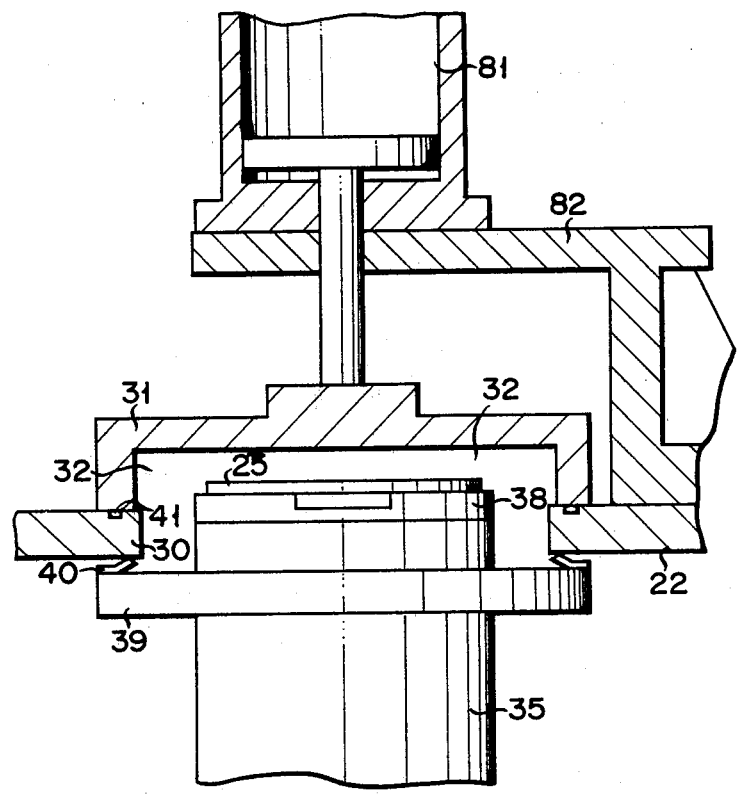
FIG. 5 is a sectional view showing the specimen feeding mechanism.

In a part of the lower wall of said projection 22 is formed an opening in facing relation to said opening 30. Through this opening protrudes a table 35 supported from beneath, maintaining a state of airtightness. A driving mechanism 37 is mounted to the shaft 36 extruding to the lower end of the supporting table 35. This driving mechanism 37 causes the supporting table to move 35 up and down via the shaft 36 and is constructed by a combination of a bolt, nut, and motor, for instance. The upper surface of said supporting table is flat and has an electrostatic check 38 capable of sucking the specimen 25 thereon, as shown in FIG. 5. A flange 39 is formed on the outer circumference of the supporting table 35 near its top surface and a mechanical seal (wilson seal) 40 is formed with ring-shaped rubber plate provided on top of the flange 39. When the supporting table 35 is moved upward, the mechanical seal 40 comes into contact with the inside surface of the upper wall of said projection 22 in a manner to surround said opening 30 so that the flange 39 closes the opening 30 from inside. That is to say that the connection between the first wafer spare chamber 22a and the subchamber 32 is closed by the flange 39. In FIG. 5, numeral 41 indicates an O-ring which is disposed on the upper wall of the projection 22 and comes into contact with the lower end surface of the moving member 31 to more securely shut off the subchamber 32 from outside. The first specimen feeding mechanism 42 is so composed as described above. This mechanism makes it possible to feed the specimen (wafer) into the first wafer spare chamber 22a without destroying a state of airtightness.

Figure 6:
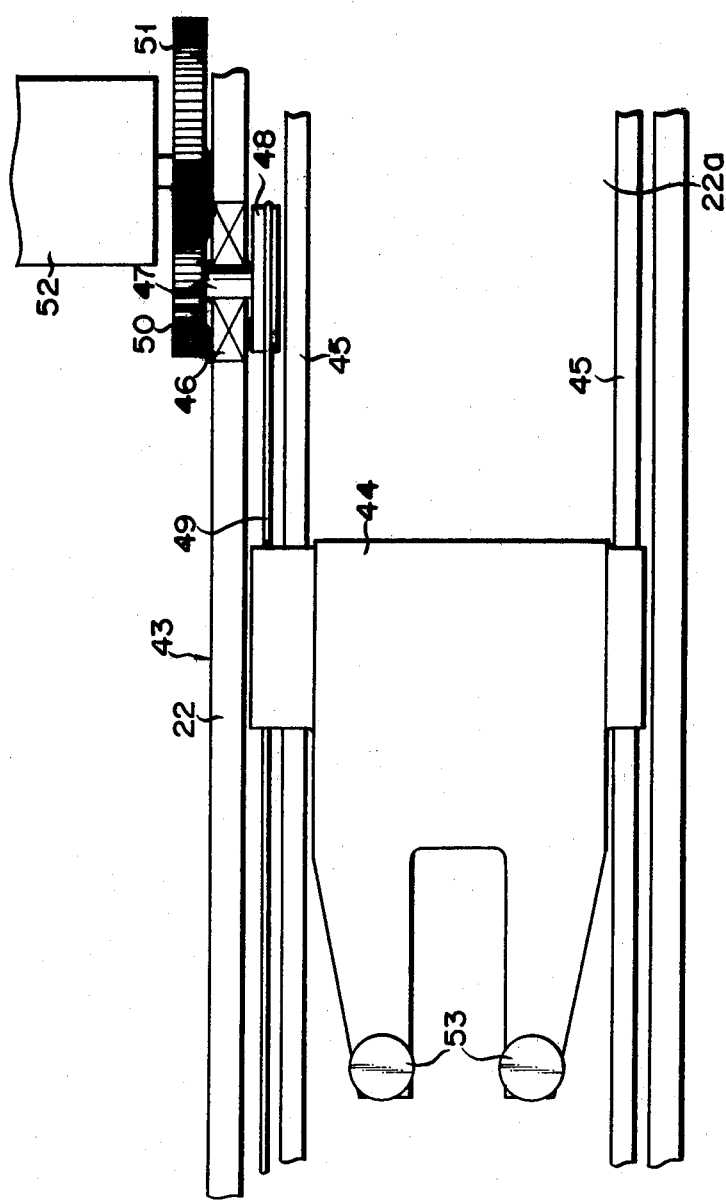
FIG. 6 is a plan view showing the specimen transfer mechanism.

In said first water spare chamber is placed a transfer mechanism 43 by which the specimen which has been fed outside is transferred onto the specimen stand 26. As illustrated in FIG. 6, the transfer mechanism 43 has a plate-like arm 44, which is supported by a pair of supporting rails 45 extending in the first wafer spare chamber 22a horizontally along the chamber's wall in such a manner that it move along the rails 45. On one side wall of the protruding end of the first projection 22 is mounted a bearing 46 which supports a shaft 47 in such a manner that it can rotate and its both ends protrude beyond the side wall. The bearing 46 and shaft 47 are so disposed that a state of vacuum within the first wafer spare chamber 22a can be maintained. A pulley 48 is fixed to one end of said shaft 47 extending into the first wafer spare chamber 22a. Between this pulley 48 and a pulley (not illustrated) disposed within the evacuated chamber is stretched an endless belt 49, to which is attached one side end of said arm 44. A first gear 50 is fixed to the other end of said shaft 47 located outside the projection 22. The gear 50 meshes with a second gear 51 which is fixed to the rotating shaft of the motor 52 which is disposed outside the projection 22. Thus the arm 44 driven by the motor 52 via the gear train and endless belt 49 to move backward and forward between the subchamber 32 and the specimen stand 26. There is provided a limit switch to cause the arm 44 to stop in a desired position in relation to the subchamber 32 and the specimen stand 26. The motor 52 is stopped when the limit switch is closed by the traveling arm 44. Numeral 53 in FIG. 6 indicates electrostatic chucks displaced on the arm 44. The chucks hold the specimen 53 by suction so that the specimen 53 is transferred by the arm 44. To the subchamber 32 is connected a vacuum pump 92 for evacuating this chamber, as illustrated in FIG. 4.

The first feeding mechanism 42 functions to feed a specimen from outside into the first wafer spare chamber 22a and the transferring mechanism 43 functions to transfer the specimen 25 onto the specimen stand 26. Another feeding mechanism 42 and transferring mechanism 43 of substantially the same construction as above-mentioned mechanism are disposed in the wafer spare chamber 23a. This transferring mechanism functions to transfer a specimen with an impressed pattern into the second wafer spare chamber 23a and the transferring mechanism functions to transfer the specimen to outside.

Figure 7:
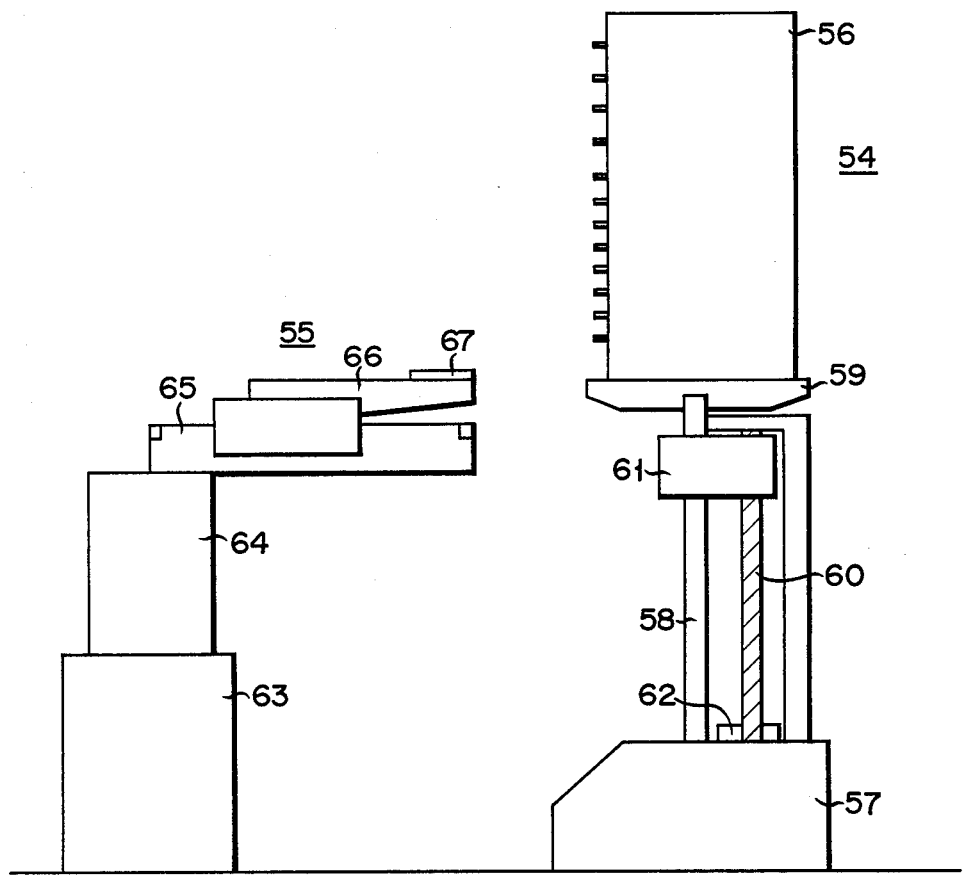
FIG. 7 is a side view showing the mechanism to feed wafers into the subchamber and the index station.

As illustrated in FIG. 7, at the side of said projection are disposed an index station 54 containing specimens (wafers) and a second transferring mechanism 55 which transfers the specimen from the index station 54 to the electrostatic chuck 38 on said supporting stand 35.

The index station 54 has a wafer carrier 56 which is capable of containing one lot of 25 wafers properly spaced in the vertical direction. This carrier 56 is mounted in a fixed position on a wafer carrier stand 59 which is supported by a vertically movable supporting stand 57 via a supporting column 58. A feed thread 60 is rotataby provided parallel to the supporting column 58. This thread 60 meshes with the supporting stand 57 which is supported by the guiding bearing 61 disposed on the supporting column 58 and the rotating shaft of the motor 62 is connected to the feed thread 60. Thus the feed thread 60 is caused to rotate by means of the motor 62 so that the supporting stand 57, that is, the wafer carrier 56 is vertically moved.

Said second feeding mechanism 55 has a base 63, on which is provided a supporting column 64 which is extendable in a vertical direction. On the upper end of the supporting column 64 is fitted rotatably a rotative arm 65, to which is fitted a supporting arm 66 which is extendable in a horizontal direction. The base 63 contains a driving mechanism to move the supporting column 64 up and down, the supporting column 64 contains a driving mechanism to rotate the rotative arm 65 through 90 degrees, and the rotative arm 65 contains a driving mechanism to protract or retract the supporting arm 65. A vacuum chuck 67 is disposed on top of the end of the supporting arm 66. Thus, as illustrated in FIG. 7, when the supporting arm 66 is in facing relation to the wafer carrier 56, the arm is protracted or retracted so that the vacuum chuck 67 comes into a position under a specific wafer in the carrier 56. Then the carrier is moved downward so that the wafer is sucked by the vacuum chuck 67 and thereafter the supporting arm 66 is moved back into its former position and rotated through 90 degrees. The mechanism is so designed that when the arm is rotated as stated above the wafer position coincides with the position of the electrostatic chuck 38 on the supporting stand 35.

Figure 8:
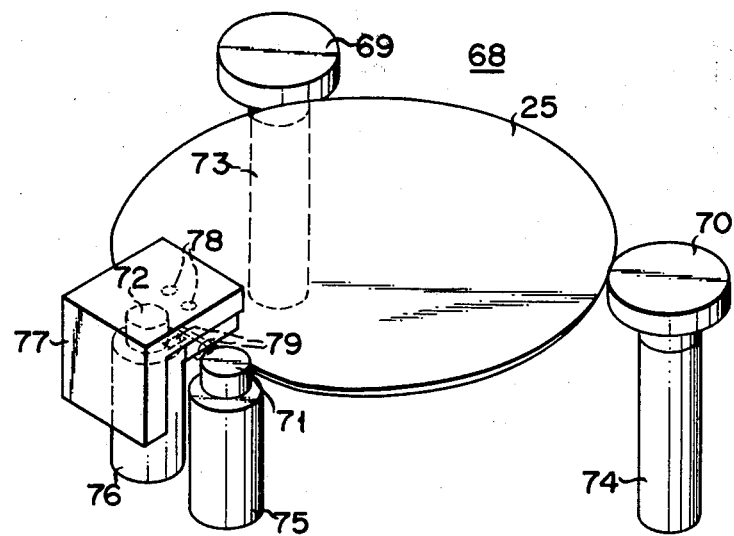
FIG. 8 is a perspective view showing the positioning mechanism.
Figure 9:
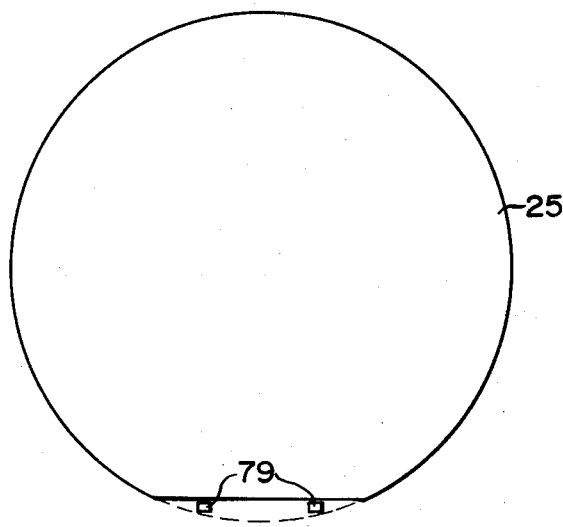
FIGS. 9 and 10 are a plan view and a perspective view showing the relation of the positioning mechanism and the orientation flat of a wafer.
Figure 10:
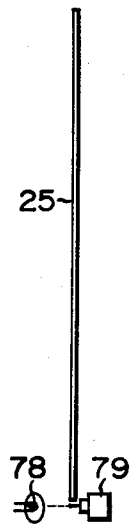

In the device according to this embodiment of the present invention is provided a positioning mechanism 68, as shown in FIG. 8, to place the orientation flat of a wafer in the prescribed position when the wafer is placed on the supporting stand 35 in the first wafer spare chamber 22a. This mechanism 68, which is displaced in the first wafer spare chamber, has four horizontally movable driving rollers 69, 70, 71, 72. These rollers are connected with the rotating shafts of four motors 73, 74, 75, 76, respectively, so that they are rotated by these motors. The third and four rollers 71 and 72 are disposed closely adjacent to each other. The first and second rollers 69 and 70 are displaced roughly equidistant from the rollers 71 and 72. In the proximity of said third and four driving rollers 71 and 72 is disposed a supporting stand 77 and on the underside of the extending portion of the supporting stand 77 are disposed a pair of light-emitting elements 78 spaced at a prescribed distance in between the third and fourth driving rollers 71 and 72. These light-emitting elements 78 are positioned above the periphery of the wafer (specimen) 25. Under the periphery of the wafer 25 is also disposed a pair of photosensitive elements 79 in facing relation to the light-emitting elements 78. These photosensitive elements 79 are connected to switching circuits so as to stop said four motors 73, 74, 75, 76 when both of these photosensitive elements have received the light from the light-emitting elements 78. In the positioning mechanism 68, after the wafer 25 has been brought into the standby position and the suction of the electrostatic chuck 38 has been released, the following operations are performed. First, the four driving rollers 69, 70, 71, 72 are moved horizontally inward until they come into contact with the peripheral edge of the wafer 25 and at the same time they are rotated in the same direction by the respective motors. As a result the wafer 25 is rotated in a direction opposite to the rollers. When the orientation flat of the wafer has come into the prescribed position as illustrated in FIGS. 9 and 10 the light from the light-emitting elements 78 which has so far been shut off by the periphery of the wafer reaches the photosensitive elements 79 through the orientation flat. As a result the signal from the photosensitive elements 79 stops the motors and consequently the driving rollers. Thus the wafer 25 stops rotating and may be set in the prescribed position. Thereafter the electrostatic chuck 38 sucks the wafer 25 and at the same time the driving rollers are detached from the wafer and moved back into the standby position.

Figure 11:
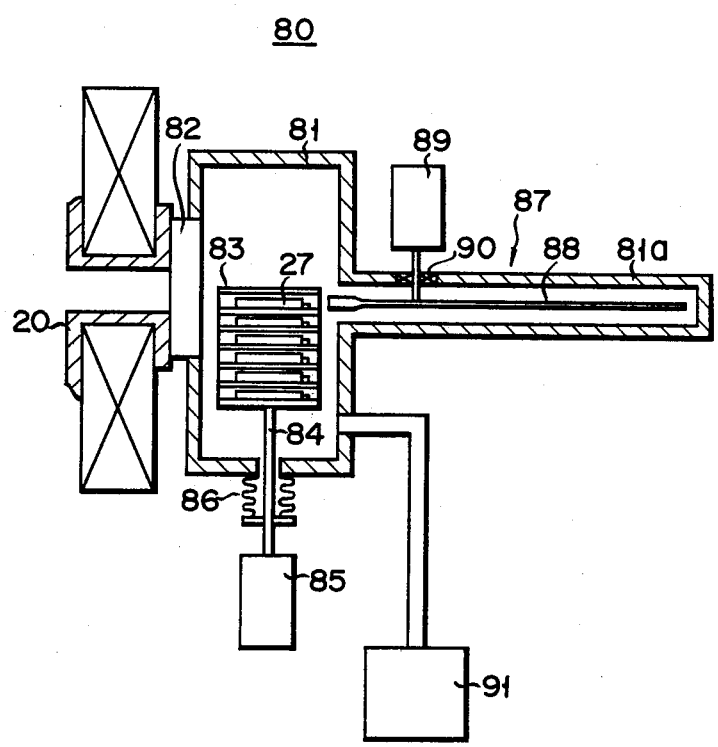
FIG. 11 is a sectional view showing the mask feeding mechanism.

As illustrated in FIG. 4, said evacuated vessel 20 is connected to the mask feeding mechanism 80 disposed at roughly right angles to the projections 22 and 23. This feeding mechanism 80 is stocked in advance with a plurality of photoelectric masks 27, which are fed one by one into the mask holder 28 (FIG. 3) in the evacuated vessel 20. This mask feeding mechanism 80 has such a construction as illustrated in FIG. 11, in which numeral 81 indicates a mask spare chamber which is connected to the evacuated vessel 20 via a gate valve 82. This mask spare chamber 81 houses a photoelectric mask cassette magazine 83 which holds the photoelectric masks 27 properly spaced in the vertical direction. This magazine 83 is fixed to the upper end of a supporting column 84 which is vertically disposed. The lower end of the supporting column 84 extends downward through the lower wall of the spare chamber 81. To the lower end of the supporting column 84 is connected to a means to move said column up and down, such as the piston of a hydraulic or air cylinder 85 for instance. The middle section of the supporting column 84 is surrounded by a bellows 86 disposed on the lower wall of the spare chamber 81 so that the cassette magazine 83 can be moved up and down by means of the driving cylinder 85 without destroying a state of vacuum in the spare chamber 81. In the horizontal projection 81a of said spare chamber 81 is disposed a mask transfer mechanism 87, which has a transfer arm 88 movably disposed in a horizontal direction within the projection 81a. On the side of the transfer arm 88 is formed a rack which meshes with a pinion fitted to the end of the rotating shaft of a DC motor 89 so that the arm 88 can be moved horizontally by means of the motor 89. This motor 89 is placed outside the projection 81a and its rotating shaft extends into the projection 81a via an airtight bearing 90 which is disposed in the upper wall of the projection 81a. In the feeding mechanism 80 as described above, the motor 89 is operated in the manner as illustrated in FIG. 11 and the arm 88 is moved forward so that its end brought into the cassette magazine 83 and then the driving cylinder 85 is driven to move the magazine 83 slightly downward. As a result a particular photoelectric mask 27 in the magazine 83 is placed onto the end of the arm 88. Thereafter the motor 89 is operated again so that the arm 88 is moved further forward and the photoelectric mask 27 is brought into the mask holder in the evacuated vessel 20 through the gate valve 82. To remove an unwanted photoelectric mask out of the mask holder, the above procedure is reversed to transfer it from the mask holder back to the cassette magazine 83 by means of the arm 88. Numeral 91 in FIG. 11 indicates a vacuum pump for evacuating the mask spare chamber 81.

Figure 1:
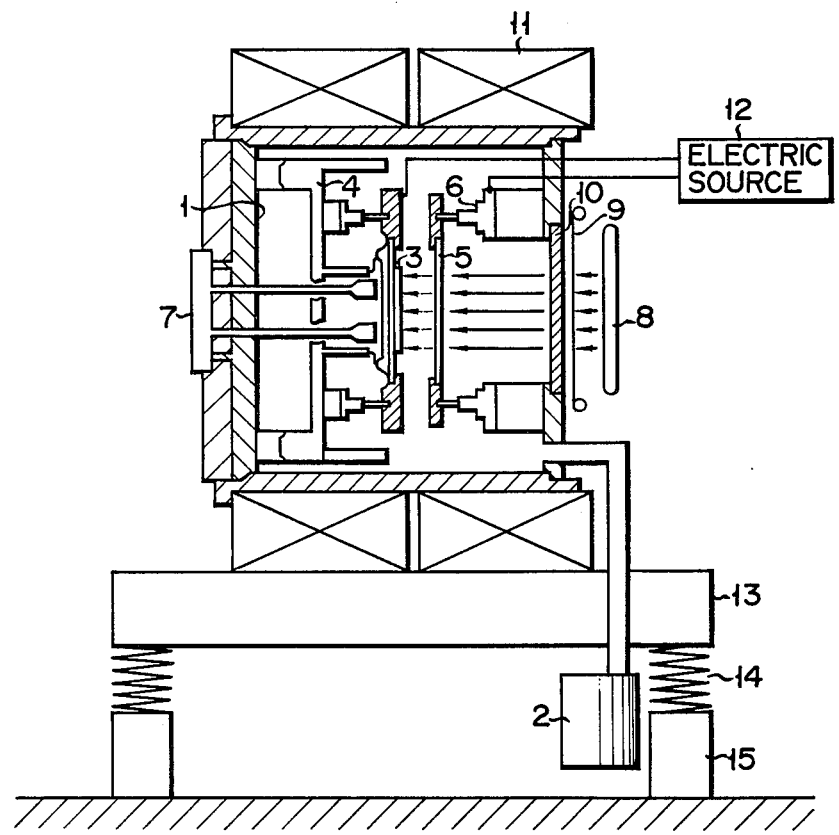
FIG. 1 is a schematic diagram of a conventional electron-beam image transfer device.
Figure 2:
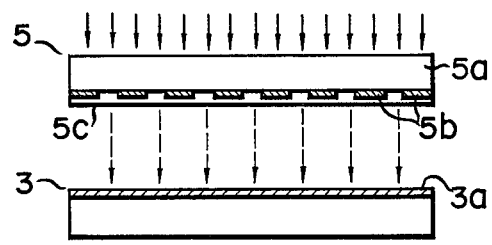
FIG. 2 is a view for explaining the process by which the pattern on the photoelectric mask is transferred onto the wafer.

In the above embodiment, the parts which use techniques substantially the same as the conventional techniques and are not related to the principles of the present invention are designated by the same reference numerals as those which are used in FIG. 1 and no particular explanations are given. The operation of electron-beam image transfer device of said construction will be described below.

First, a specific photoelectric mask 27 is transferred from the photoelectric mask cassette magazine 83 into the image transfer chamber by means of the transfer arm 88 and the mask is held by the mask holder 28. On the other hand, the specimen (wafer) 25 is sucked off the wafer carrier 56 onto the electrostatic chuck 38 on the supporting stand 35 which is provided on the first wafer spare chamber 22a side. At this time the electrostatic chuck 38 has been moved beforehand upward as illustrated in FIG. 5 and the moving member 31 has also been moved upward by means of the driving cylinder 34 and therefore the electrostatic chuck 38 is exposed to the outside through the opening 30 to permit the specimen 25 to be placed thereon. When the specimen 25 is sucked onto the electrostatic chuck 38, the moving member 31 is moved downward into the lower position as shown in FIG. 5, thereby to make the subchamber 32 airtight. This subchamber 32 is evacuated by means of the vacuum pump 92 and subsequently the supporting stand 35 is moved downward, that is, until the specimen 25 comes into the prescribed position within the first wafer spare chamber 22a. In this position, the specimen 25 is properly positioned by means of the positioning mechanism 43 and then moved onto the specimen stand 26 by means of the transfer mechanism 43 and sucked thereon. On the specimen stand 26, the specimen 25 is set in the prescribed position in relation to the photoelectric mask 27 by the movement of the specimen stand 26 while its position being detected by the detecting mechanism 29. The Helmholtz coils 11 are energized to generate a magnetic field along the direction in which the specimen 25 and the photoelectric mask 27 face each other and at the same time an electric field is impressed in the same direction as the magnetic field by means of the power source 12. Then the shutter 9 is opened to allow the ultraviolet rays from the light source 8 to pass through the ultraviolet ray passing window to irradiate onto the photoelectric mask 27. As a result the photoelectric mask 27 releases photoelectrons according to the mask pattern and the photoelectrons are focused by said magnetic field and electric field to fall onto the specimen 25. Thus the resist on the specimen 25 is exposed to the photoelectrons according to said mask pattern so that the pattern is transferred onto the specimen 25. The specimen 25 on which the pattern has been transferred moved into the second wafer spare chamber 23a by means of the transferring mechanism 43 which is disposed on the second wafer spare chamber 23a side and delivered therefrom to the outside via the feeding mechanism 42. The specimen removing operation is carried out simultaneously with the next specimen feeding operation.

An electron-beam machine according to another embodiment of the present invention will be described with reference to FIG. 12.

Figure 12:
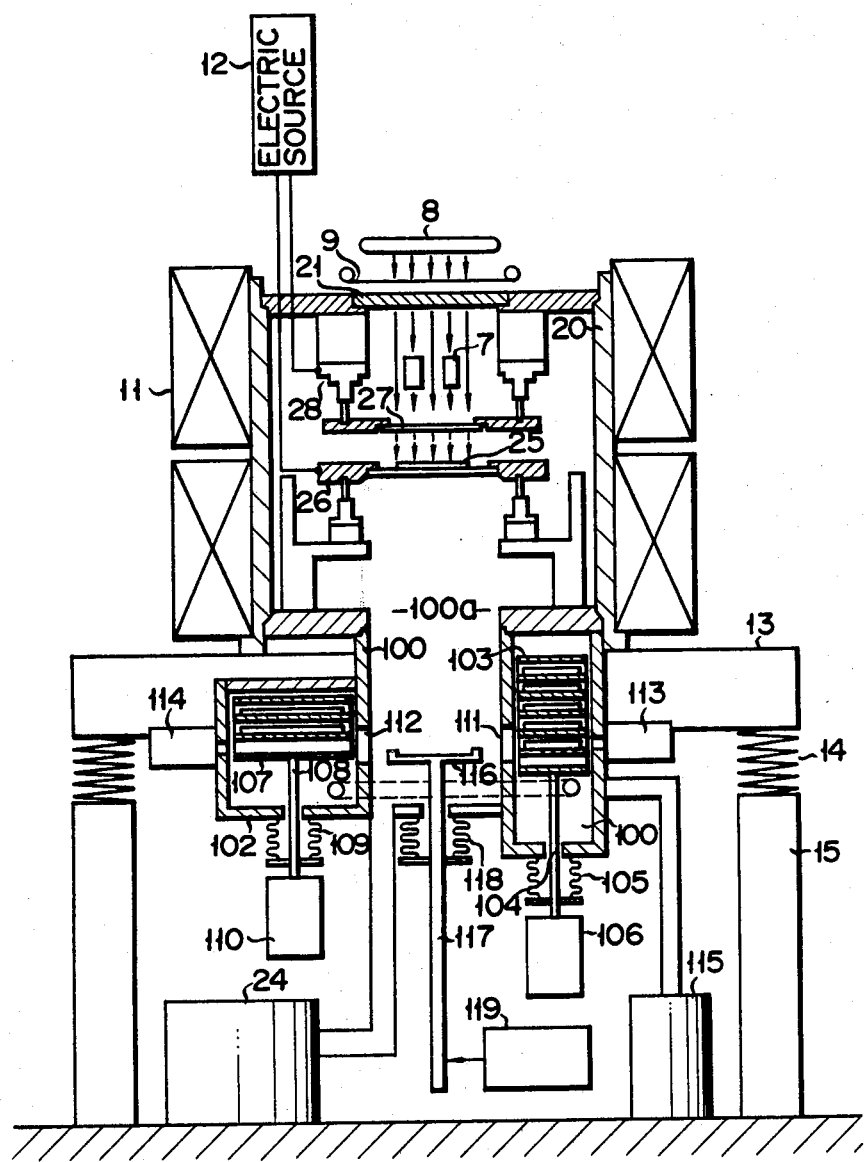
FIG. 12 is a simplified perspective view of an electron-beam image transfer device according to another embodiment of the present invention.

In FIG. 12, the parts which are substantially the same with the previously described embodiment are designated by the same reference numerals and explanations are omitted.

The evacuated vessel 20 has a cylindrical projection 100 extending downward from its bottom. A spare chamber 100a connecting to the image transfer chamber is formed within the projection 100. A wafer subchamber 101 and the mask subchamber 102 are disposed outside the projection 100. The first subchamber 101 contains a number of specimens (wafers) properly spaced in the vertical direction supported by a supporting stand 103. From the supporting stand 103 extends downward a supporting column 104. This supporting column 104 extends out of the subchamber 101 through the bellows 105 which is disposed on the lower wall of the subchamber 101. On the distal end of the extending supporting column 104 is disposed a driving mechanism 106 which is capable of moving the supporting column 104 up and down. Said second subchamber 102 contains a number of photoelectric masks properly spaced in the vertical direction and supported by a cassette magazine 107. The upper end of a supporting column 108 is fitted to the underside of the cassette magazine 107. The lower end of the supporting column 108 extends to the outside through a bellows 109 which is disposed on the lower wall of the second subchamber. On the lower end of the supporting column 108 is mounted a driving mechanism 110 which is capable of moving the supporting column up and down. Said first subchamber 101 is connectable to the spare chamber 100a through a gate valve 111 which is disposed on its side wall. The second subchamber 102 is connectable to the spare chamber 100a through a gate valve 112 which is disposed on its side wall in facing relation to said gate valve 111. In these subchambers 101 and 102 are disposed transfer mechanisms 113 and 114, by means of which the specimens and photoelectric masks are transferred into the spare chamber 100a through the gate valves. The subchambers 101 and 102 are connected with a vacuum pump 115 to evacuate said subchambers. In said spare chamber 100a is disposed a supporting stand 116, to which is fitted the upper end of a supporting column 117. The lower end of the supporting column 117 extends to the outside through a bellows 118 which is disposed on the lower wall of the projection 100. On the distal end of the extending supporting column 117 is mounted a driving mechanism 119, by which the supporting column 117 is moved up and down so that the supporting stand 116 is moved between the lower position roughly level with the valve gates 111 and 112 and the upper position near the specimen stand 26.

The operation of the electron-beam image transfer device illustrated in FIG. 12 is described below.

Since this device is identical to the device according to the first embodiment in respect of image transferring operation, only the photoelectric mask 27 and the specimen 25 transferring operation will be described hereinunder. First, the cassette magazine 107 is moved by means of the photoelectric mask driving mechanism 110 so that a desired photoelectric mask is positioned in between the transferring mechanism 114 and the gate valve 112. Then the gate valve 112 is opened and the photoelectric mask is transferred by means of the transferring mechanism 114 onto the supporting stand 116, which has been brought beforehand in the lower position as illustrated, within the spare chamber 110a. Then the supporting stand 116 is moved upward by means of the driving mechanism 119 so that the photoelectric mask is supported by the supporting mechanism 28 and thereafter the supporting stand is moved back into the lower position. Next, the supporting stand 103 is moved by means of the driving mechanism 106 so that the desired specimen (wafer) is positioned between the transferring mechanism 113 and the gate valve 111. Then the gate valve 111 is opened and the specimen is transferred by means of the transferring mechanism 113 onto the supporting stand 116 in the spare chamber 100a. The supporting stand 116 is moved upward so that the specimen is supported on the supporting stand 26. The specimen on which an image of pattern has been produced by a prescribed exposing procedure is carried by means of the supporting stand 116 from the image transferring chamber to the spare chamber 100a and then delivered by means of the transferring mechanism 113 into a prescribed position on the supporting stand 103 through the gate valve 111. During these operations, the image transferring chamber and the spare chamber are evacuated by one vacuum pump 24 and the subchambers 101 and 102 are evacuated by the other vacuum pump 115. When the specimen and mask in the subchambers are to be changed with new ones, the gate valves 111 and 112 must be closed to cut off the connection between the subchambers and the spare chamber. And the subchambers are evacuated again after completion of the changing of specimen and mask.

What we claim is:

1. An electron-beam image transfer device for transferring a pattern on a photoelectric mask onto a specimen comprising:
   an evacuated vessel having a main chamber;
   U.V. source means placed outside of said main chamber for providing U.V. rays;
   guiding means coupled to said evacuated vessel for guiding said U.V. rays from said U.V. source means into said main chamber;
   a specimen holder disposed in said main chamber to hold said specimen detachably in fixed position;
   a mask holder disposed in said main chamber to hold said photoelectric mask detachably in fixed position in facing relation to said specimen;
   means to impress a magnetic field and an electric field to said specimen and photoelectric mask in the direction in which they face each other;
   first and second subchambers disposed in the proximity of said evacuated vessel to house the specimen and photoelectric mask, respectively;
   first and second gates disposed between the main chamber and the first and second subchambers to enable selective connection and an airtight seal between them;
   a first auxiliary transferring mechanism to transfer the specimen from said first subchamber into the main chamber through said first gate;
   a second auxiliary transferring mechanism to transfer the photoelectric mask from said second subchamber into the main chamber through the second gate;
   a main transferring mechanism to transfer the specimen and photoelectric mask, which have been brought into the main chamber, onto said specimen holder and mask holder; and
   an evacuating means to evacuate said main chamber and subchambers.

2. The electron-beam image transfer device of claim 1, said main chamber has an image transferring chamber in which said specimen holder and mask holder are disposed, the first and second spare chambers connecting to the image transferring chamber, the first subchamber being connected to the first spare chamber through said first gate; another first subchamber, another first spare chamber, and another first gate capable of selective connection and an airtight seal between another first spare chamber and another first subchamber; said main transferring mechanism has a feeding arm to transfer the specimen from the first spare chamber to the specimen holder and a removing arm to the transfer specimen from the specimen holder to another first spare chamber.

3. The electron-beam image transfer device of claim 2, said first subchamber and another first subchamber extend horizontally in opposite directions and said feeding arm and removing arm can be moved in the direction in which the subchamber is extending.

4. The electron-beam image transfer device of claim 3, said first auxiliary transferring mechanism has a specimen supporting stand which is vertically movable between the lower position located in said first spare chamber and the upper position located outside the first spare chamber with a state of vacuum maintained therein; a moving member which is vertically movable between the lower position where it contacts the outside surface of the evacuated vessel to define said first subchamber between the evacuated vessel and the moving member and the upper position where the moving member separates from the outside surface of the evacuated vessel to expose the first subchamber to the atmosphere; means to move the specimen supporting stand upward when the moving member is in its lower position and then move it downward after the moving member has been moved upward to enable the feeding of specimen, evacuate the first subchamber by the evacuating means and then move said specimen supporting stand into its lower position so that the specimen placed on the moving stand can be transferred by means of the feeding arm.

5. The electron-beam image transfer device of claim 4, said first spare chamber has a mechanism disposed therein to position the specimen placed on the supporting stand.

6. The electron-beam image transfer device of claim 1, said main chamber has an image transferring chamber and a spare chamber extending downward therefrom, said first and second subchambers are connected to the spare chamber through said first and second gates, and said main transferring mechanism has an arm which selectively support the specimen and photoelectric mask and can be moved vertically between the lower position in the proximity of the gates and the upper position near the specimen and mask holders.

* * * * *

UNITED STATES PATENT AND TRADEMARK OFFICE
CERTIFICATE OF CORRECTION

PATENT NO. : 4,467,210

DATED : August 21, 1984

INVENTOR(S) : Sugihara et al.

It is certified that error appears in the above-identified patent and that said Letters Patent is hereby corrected as shown below:

Filing Date should read as follows:

--[22] Filed: May 19, 1982 --

Signed and Sealed this

Twelfth Day of March 1985

[SEAL]

Attest:

DONALD J. QUIGG

Attesting Officer     Acting Commissioner of Patents and Trademarks